US012598851B2

(12) United States Patent
Hashimoto

(10) Patent No.: US 12,598,851 B2
(45) Date of Patent: Apr. 7, 2026

(54) DISPLAY STRUCTURE IN WHICH A PLURALITY OF LIGHT EMITTING ELEMENTS ARE PROVIDED ON A SUBSTRATE

(71) Applicant: Panasonic Intellectual Property Management Co., Ltd., Osaka (JP)

(72) Inventor: Akifumi Hashimoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 367 days.

(21) Appl. No.: 18/548,196

(22) PCT Filed: Oct. 21, 2021

(86) PCT No.: PCT/JP2021/038912
§ 371 (c)(1),
(2) Date: Aug. 28, 2023

(87) PCT Pub. No.: WO2022/185603
PCT Pub. Date: Sep. 9, 2022

(65) Prior Publication Data
US 2024/0145660 A1 May 2, 2024

(30) Foreign Application Priority Data
Mar. 4, 2021 (JP) ................................. 2021-034395

(51) Int. Cl.
*H10H 20/85* (2025.01)
*H10H 20/857* (2025.01)
*H10W 90/00* (2026.01)

(52) U.S. Cl.
CPC .......... *H10H 20/857* (2025.01); *H10W 90/00* (2026.01)

(58) Field of Classification Search
CPC .......................... H10H 20/857; H01L 25/0753
(Continued)

(56) References Cited

U.S. PATENT DOCUMENTS

2014/0168037 A1 6/2014 Sakariya et al.
2015/0356918 A1 12/2015 Sakariya et al.
(Continued)

FOREIGN PATENT DOCUMENTS

CN 108352147 A * 7/2018 ............... G09G 3/32
JP 6317758 B2 4/2018
(Continued)

OTHER PUBLICATIONS

International Search Report dated Dec. 14, 2021 issued in International Patent Application No. PCT/JP2021/038912, with English translation.

*Primary Examiner* — Phuc T Dang
(74) *Attorney, Agent, or Firm* — Rimon P.C.

(57) ABSTRACT

The display structure includes a film-like substrate, a plurality of light-emitting elements, and a plurality of main wires. Each of the light-emitting elements includes an anode terminal and a cathode terminal. The plurality of main wires include a plurality of anode wires and a plurality of cathode wires. The plurality of anode wires are electrically connected to the anode terminal, in parallel to one another, and the plurality of cathode wires are electrically connected to the cathode terminal, in parallel to one another.

4 Claims, 7 Drawing Sheets

(58) Field of Classification Search
USPC .......................................................... 257/91
See application file for complete search history.

(56) References Cited

U.S. PATENT DOCUMENTS

| 2017/0206845 | A1 | 7/2017 | Sakariya et al. |
| 2018/0049318 | A1 | 2/2018 | Maki |
| 2018/0190211 | A1 | 7/2018 | Sakariya et al. |
| 2020/0005720 | A1 | 1/2020 | Sakariya et al. |
| 2020/0154564 | A1 | 5/2020 | Maki |
| 2021/0020122 | A1 | 1/2021 | Sakariya et al. |
| 2021/0175282 | A1 | 6/2021 | Ikeda et al. |
| 2021/0235561 | A1* | 7/2021 | Fischer .................. H05B 45/46 |

FOREIGN PATENT DOCUMENTS

| WO | 2016/178322 | A1 | 11/2016 |
| WO | 2020/021978 | A1 | 1/2020 |
| WO | WO-2020230497 | A1 * | 11/2020 | ........... H10D 86/441 |

* cited by examiner

DISPLAY STRUCTURE IN WHICH A PLURALITY OF LIGHT EMITTING ELEMENTS ARE PROVIDED ON A SUBSTRATE

CROSS-REFERENCE OF RELATED APPLICATIONS

This application is the U.S. National Phase under 35 U.S.C. § 371 of International Patent Application No. PCT/ JP2021/038912, filed on Oct. 21, 2021, which in turn claims the benefit of Japanese Patent Application No. 2021-034395, filed on Mar. 4, 2021, the entire disclosures of which Applications are incorporated by reference herein.

TECHNICAL FIELD

The present disclosure relates to a display structure.

BACKGROUND ART

Display structures using light-emitting elements such as micro LED elements described in Patent Documents 1 and 2, for example, have been known.

Patent Document 1 discloses a display structure including a substrate made of a hard material such as a glass substrate, a plurality of light-emitting elements (micro LEDs) provided on the substrate, and a single wire provided on the substrate and electrically connected to each of the plurality of light-emitting elements.

Patent Document 2 discloses a display structure in which a plurality of light-emitting elements are provided on a substrate made of a glass material or a resin film.

CITATION LIST

Patent Document

Patent Document 1: Japanese Patent No. 6317758
Patent Document 2: PCT International Publication No. WO 2020/021978

SUMMARY OF THE INVENTION

Technical Problem

In the display structure of Patent Document 1, a single wire is electrically connected to each light-emitting element. That is, in the above display structure, the current flowing through each light-emitting element flows, as it is, to the single wire. Therefore, when a large current is applied to each light-emitting element to achieve high luminance of each light-emitting element, the amount of heat generated in the single wire increases according to the amount of current flowing through each light-emitting element.

For example, when a film-like substrate that is made of a resin material (e.g., PET) having a relatively low heat resistance as indicated in Patent Document 2 is applied to the display structure of Patent Document 1, an increase in the temperature rise of the film-like substrate cannot be mitigated due to the heat generation of the single wire described above, and the film-like substrate is easily damaged by thermal melting. This may lead to a loss in the reliability of the display structure.

The present disclosure is made in view of the above problem, and it is an object of the present disclosure to increase the luminance of light-emitting elements while avoiding damage to the substrate, even in a case of applying a film-like substrate made of a resin material.

Solution to the Problem

In order to achieve the above object, a display structure according to an embodiment of the present disclosure includes: a film-like substrate made of a resin material; a plurality of light-emitting elements provided on the substrate; and a plurality of main wires provided on the substrate and electrically connected to each of the plurality of light-emitting elements. Each of the plurality of light-emitting elements includes an anode terminal and a cathode terminal. The plurality of main wires include a plurality of anode wires and a plurality of cathode wires. The plurality of anode wires are electrically connected to the anode terminal, in parallel to one another, and the plurality of cathode wires are electrically connected to the cathode terminal, in parallel to one another.

Advantages of the Invention

According to the present disclosure, it is possible to increase the luminance of the light-emitting elements while avoiding damage to the film-like substrate.

DESCRIPTION OF EMBODIMENTS

Embodiments of the present disclosure will be described in detail below with reference to the drawings. The following description of the embodiments is merely exemplary in nature and is not intended to limit the present disclosure, its application, or its uses.

First Embodiment

Figure 1:
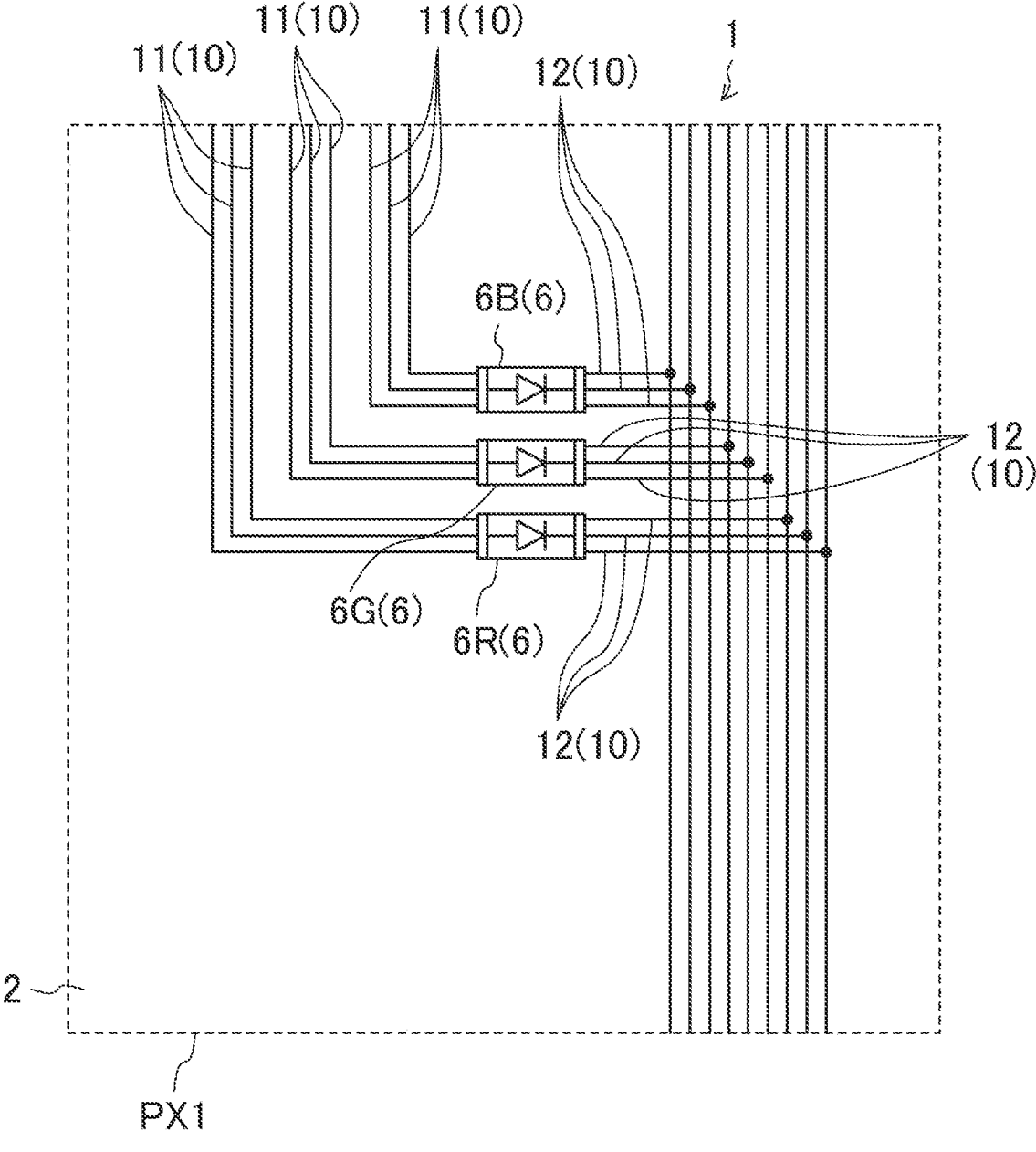
FIG. 1 is a plan view schematically showing a single pixel constituting a passive drive type display structure according to a first embodiment.

FIG. 1 shows a part (a single pixel PX1) of a display structure 1 according to a first embodiment of the present disclosure. The display structure 1 is a display structure in which a plurality of light-emitting elements 6 (described later) are mounted. The first embodiment illustrates a passive drive type display structure 1. Further, in the display structure 1, a touch sensor (not shown) and a cover lens (not shown) may be additionally provided on the upper side (the upper side of FIG. 2) of a first surface 3 of a substrate 2, described later, via an adhesive layer (not shown).

(Substrate)

Figure 2:
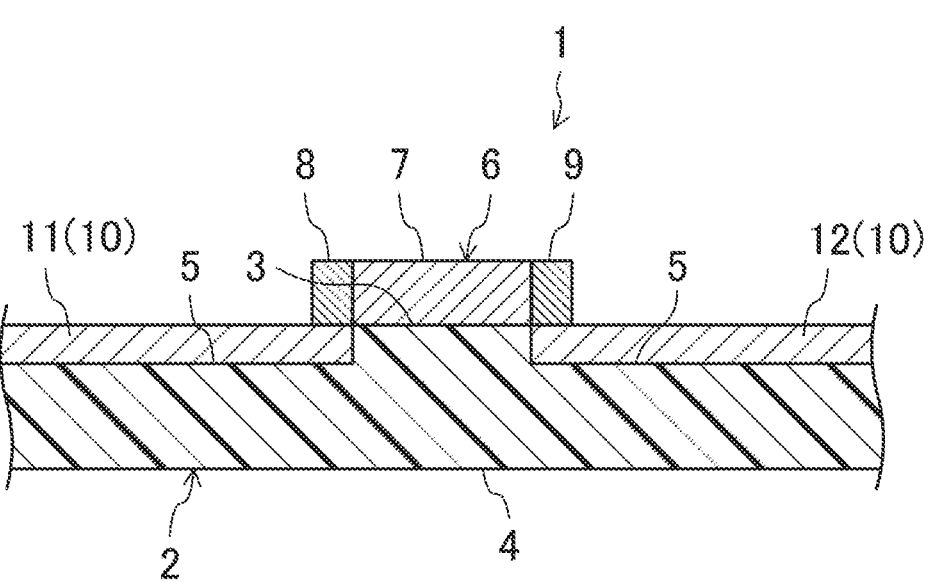
FIG. 2 is a longitudinal cross-sectional view schematically showing a connection state of each light-emitting element, an anode wire, and a cathode wire.

As shown in FIG. 1 and FIG. 2, the display structure 1 includes a film-like substrate 2. Although not shown, the substrate 2 is formed, for example, in a substantially rectangular shape in plan view.

The substrate 2 includes the first surface 3 and a second surface 4. The first surface 3 corresponds to a front side of the substrate 2. The second surface 4 corresponds to a back side of the substrate 2. In the first surface 3, a plurality of grooves 5 are formed. Each groove 5 is for embedding therein a conductive material constituting a respective main wire 10 described later.

The substrate 2 is made of a resin material. Examples of the resin material for use as the substrate 2 include: polyethylene terephthalate (PET), polycarbonate, cyclo-olefin polymer (COP), cyclo-olefin copolymer (COC), and the like. The substrate 2 may have transparency. The thickness of the substrate 2 is, for example, 50 μm to 1000 μm.

(Light-Emitting Element)

Figure 3:
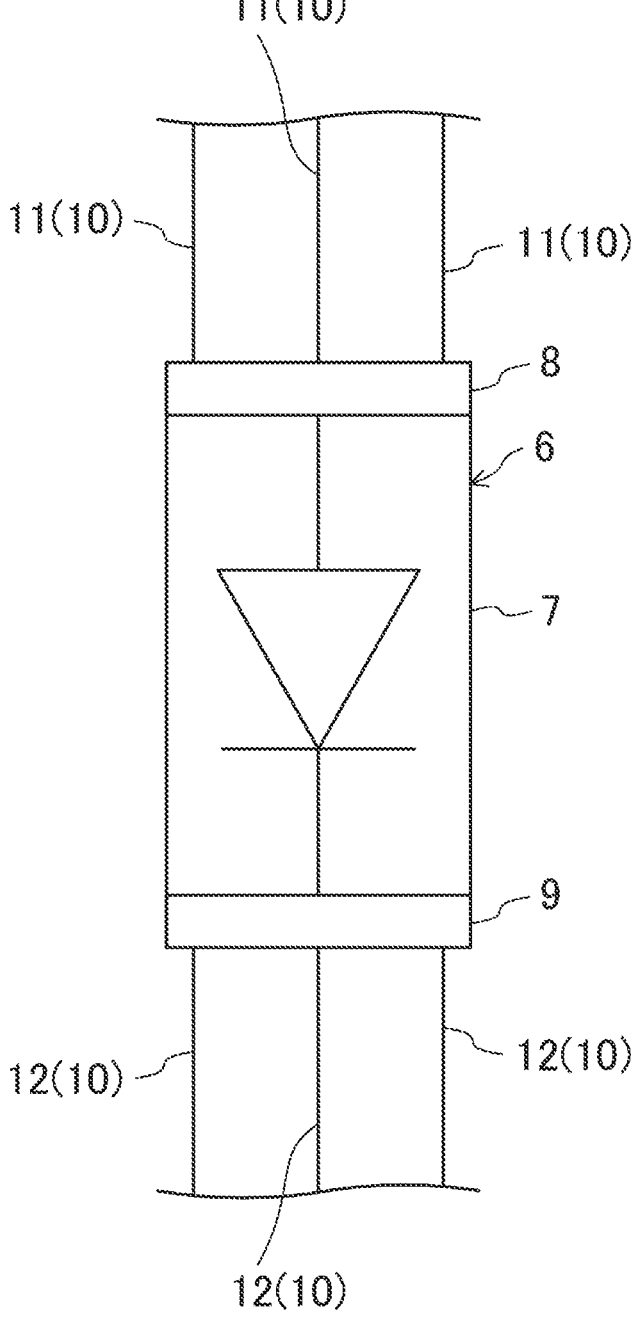
FIG. 3 is a partially enlarged view schematically showing a connection state of the light-emitting element, the anode wire, and the cathode wire shown in FIG. 1.

As shown in FIG. 1 to FIG. 3, the display structure 1 includes a plurality of light-emitting elements 6. Each light-emitting element 6 is arranged on the first surface 3 of the substrate 2. As a light-emitting element 6, for example, a micro LED element or a mini LED element is applied. For example, the micro LED element has a width or length between 10 μm and 100 μm. On the other hand, for example, the mini LED element has a width or length between 100 μm and 200 μm.

Each light-emitting element 6 includes an element body 7, an anode terminal 8, and a cathode terminal 9. The element body 7 has a rectangular parallelepiped shape, for example. The anode terminal 8 is provided on one side surface of the element body 7. The cathode terminal 9 is provided on the other side surface of the element body 7.

As described above, the first embodiment illustrates a passive drive type display structure 1. In other words, although not shown, the display structure 1 is formed in a grid pattern with a plurality of pixels PX1 arrayed longitudinally and laterally. As shown in FIG. 1, a single pixel PX1 includes a plurality of (three in the illustrated example) light-emitting elements 6. Each pixel PX1 is formed in a substantially rectangular shape with each side having the length of 1.0 mm, for example.

The plurality of light-emitting elements 6 arranged in each pixel PX1 include a light-emitting element 6R configured to emit red light, a light-emitting element 6G configured to emit green light, and a light-emitting element 6B configured to emit blue light. That is, the light-emitting element 6R configured to emit red light, the light-emitting element 6G configured to emit green light, and the light-emitting element 6B configured to emit blue light are each a sub-pixel, and the sub-pixels of three colors that are red, green, and blue constitute a single pixel PX1. The emission color of each light-emitting element 6 is not limited to the above-described emission colors, and may be any emission color.

The anode terminal 8 of each light-emitting element 6 is electrically connected to an anode driver (not shown) via an anode wire 11 described later. The cathode terminal 9 of each light-emitting element 6 is electrically connected to a cathode driver (not shown) via a cathode wire 12 described later. The cathode terminal 9 may be electrically connected to the ground (GND) via the cathode wire 12 described later.

Each light-emitting element 6 emits light upon application of a voltage thereto by driving of the anode driver and the cathode driver. Specifically, in each light-emitting element 6, the anode terminal 8 becomes high (Hi) by driving of the anode driver, and the cathode terminal 9 becomes low (Low) by driving of the cathode driver. When a voltage greater than or equal to a threshold is applied to any of the light-emitting elements 6, the light-emitting element 6 emits light.

(Plurality of Main Wires)

As shown in FIG. 1 to FIG. 3, the display structure 1 includes a plurality of main wires electrically connected to the light-emitting elements 6. The plurality of main wires 10 are provided on the first surface 3 of the substrate 2. Each main wire 10 extends linearly.

Each main wire 10 is made of a single thin wire. The thin wire is conductive. Specifically, the thin wire is made of a conductive material embedded in the groove 5 in the first surface 3 of the substrate 2. For example, a conductive metal is suitable as the conductive material. Copper, silver, copper alloy or the like are suitable as the conductive metal materials. The thin wire has a line width of 0.5 μm to 10 μm, for example. Further, the thin wire has a thickness of 0.3 μm to 10 μm, for example. As the conductive material, a conductive resin or the like may be used in addition to the conductive metal. Suitably, the plurality of main wires are made of the same conductive material and have the same line width and the same thickness (thickness dimension of the conductive material embedded in the groove 5).

The plurality of main wires 10 are constituted by a plurality of anode wires 11 and a plurality of cathode wires 12. In this embodiment, the plurality of main wires 10 include three anode wires 11 and three cathode wires 12. In other words, the plurality of main wires 10 are configured so that the number of the plurality of anode wires 11 and the number of the plurality of cathode wires 12 are equal to each other.

The plurality of anode wires 11 are spaced apart from one another in a direction orthogonal to the direction in which they extend. In other words, in this embodiment, adjacent anode wires 11, 11 are arranged so as not to cross one another. The plurality of anode wires 11 are electrically connected to the anode terminal 8, in parallel to one another. Specifically, one end portion of each anode wire 11 is connected to the anode terminal 8 by, for example, low-temperature crimping. The other end portion of each anode wire 11 is electrically connected to an anode driver (not shown).

The plurality of cathode wires 12 are spaced apart from one another in a direction orthogonal to the direction in which they extend. In other words, in this embodiment, adjacent cathode wires 12, 12 are arranged so as not to cross one another. The plurality of cathode wires 12 are electrically connected to the cathode terminal 9, in parallel to one another. Specifically, for example, one end portion of each cathode wire 12 is connected to the cathode terminal 9 by low-temperature crimping. The other end portion of each cathode wire 12 is electrically connected to a cathode driver (not shown). The other end portion of each cathode wire 12 may be electrically connected to the ground (GND).

Advantages of First Embodiment

As described above, the plurality of anode wires 11 are electrically connected to the anode terminal 8, in parallel to one another, whereas the plurality of cathode wires 12 are electrically connected to the cathode terminal 9, in parallel to one another. That is, the plurality of main wires 10 are electrically multiple parallel with respect to each light-emitting element 6. Thus, the amount of current flowing through each light-emitting element 6 is evenly distributed to the plurality of main wires 10. For example, in the first embodiment, one third of the amount of current flowing through each light-emitting element 6 flows in each main wire 10 (each anode wire 11 and each cathode wire 12). As a result, the amount of current flowing through each main wire 10 can be relatively reduced even if a large current that yields high luminance of the light-emitting element 6 is applied to each light-emitting element 6. In other words, the amount of heat generated in each of the main wires 10 is relatively reduced. This sufficiently mitigates the effect of heat (i.e., temperature rise of the substrate 2) on the film-like substrate 2, which is made of a resin material having relatively low heat resistance. As a result, damage to the substrate 2 due to thermal melting is avoided, ensuring the reliability of the display structure 1. Therefore, in the display structure 1 according to the first embodiment of the present disclosure, it is possible to increase the luminance of each light-emitting element 6 while avoiding damage to the film-like substrate 2 having low heat resistance.

The plurality of main wires 10 are configured so that the number of the plurality of anode wires 11 and the number of the plurality of cathode wires 12 are equal to each other. The above configuration can mitigate the effect of heat on the substrate 2 (the temperature rise of the substrate 2) uniformly on the side of the anode terminal 8 and the side of the cathode terminal 9. As a result, the reliability of the display structure 1 is ensured.

Second Embodiment

Figure 4:
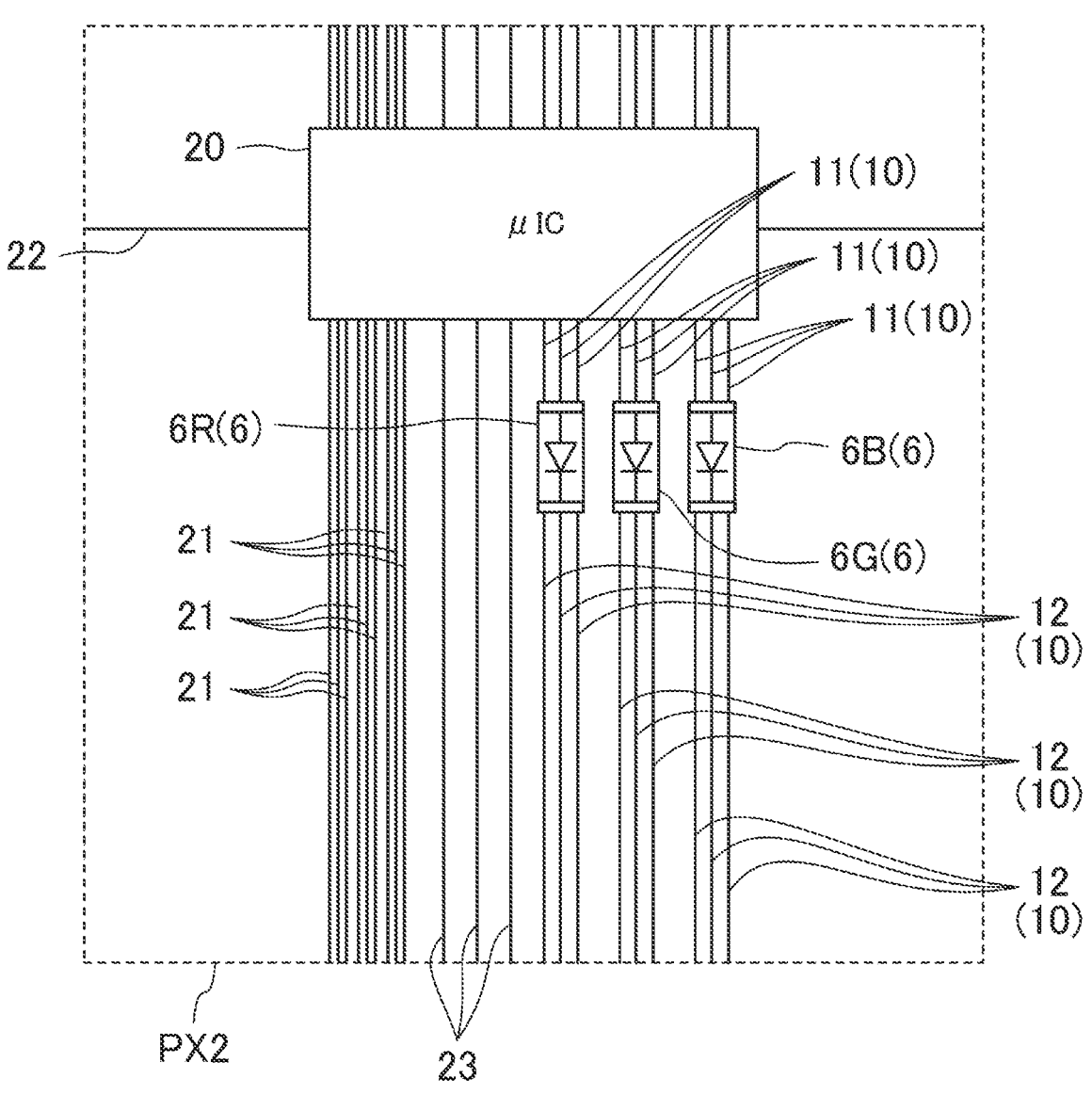
FIG. 4 is a schematic view showing a pixel constituting an active drive type display structure according to a second embodiment.

FIG. 4 shows a part (a single pixel PX2) of a display structure 1 according to a second embodiment of the present disclosure. The second embodiment illustrates an active drive type display structure 1. The other configurations of the display structure 1 according to the second embodiment are the same as those of the display structure 1 according to the first embodiment. For this reason, in the following description, the same parts as those shown in FIG. 1 to FIG. 3 are denoted by the same reference characters, and detailed description thereof will be omitted.

As shown in FIG. 4, in the active drive type display structure 1, one microcontroller is provided in a single pixel PX2. The microcontroller 20 is mounted on, for example, the first surface 3 of the substrate 2. Three light-emitting elements 6 are electrically connected to the microcontroller 20.

Similarly to the first embodiment, the display structure 1 according to the second embodiment includes a plurality of main wires 10 electrically connected to each light-emitting element 6. In the second embodiment, similarly to the first embodiment, the plurality of main wires 10 include three anode wires 11 and three cathode wires 12.

The plurality of anode wires 11 are electrically connected to the anode terminal 8, in parallel to one another. For example, one end portion of each anode wire 11 is connected to the anode terminal 8 by low-temperature crimping. The other end portion of each anode wire 11 is electrically connected to the microcontroller 20.

The plurality of cathode wires 12 are electrically connected to the cathode terminal 9, in parallel to one another. For example, one end portion of each cathode wire 12 is connected to the cathode terminal 9 by low-temperature crimping. The other end portion of each cathode wire 12 is electrically connected to a cathode driver (not shown) or ground (GND).

Thus, the plurality of main wires 10 are electrically multiple parallel with respect to each light-emitting element 6 in the second embodiment, as well. Therefore, similarly to the above first embodiment, the luminance of each light-emitting element 6 can be increased while avoiding damage to the substrate 2 having low heat resistance.

Further, the microcontroller 20 is electrically connected to various wires necessary for active driving. Specifically, a plurality of power lines 21, a single scan signal line 22, and three data signal lines 23 are electrically connected to the microcontroller 20. The plurality of power lines 21 are connected to a power driver (not shown). The scan signal line 22 is connected to a scan driver (not shown). The data signal lines 23 is connected to a data driver (not shown).

In this embodiment, the number of power lines 21 is the same as the number of main wires 10 electrically connected to the three light-emitting elements 6 (nine wires in the illustrated example). That is, one power line 21 corresponds, via the microcontroller 20, to one anode wire 11 (main wire 10) electrically connected to the light-emitting element 6.

The plurality of power lines 21 are electrically multiple parallel with respect to the light-emitting elements 6 via the microcontroller 20. This way, the amount of current to flow from the power driver (not shown) to the light-emitting elements 6 is evenly distributed to the power lines 21. As a result, the amount of current (electric power) flowing in each power line 21 is relatively reduced, and the amount of heat generated in each power line 21 is relatively reduced. This can mitigate sufficiently the effect of heat on the substrate 2 (temperature rise of the substrate 2) even in a case of adopting a film-like substrate 2 made of a resin material with relatively low heat resistance.

[First Variation]

Figure 5:
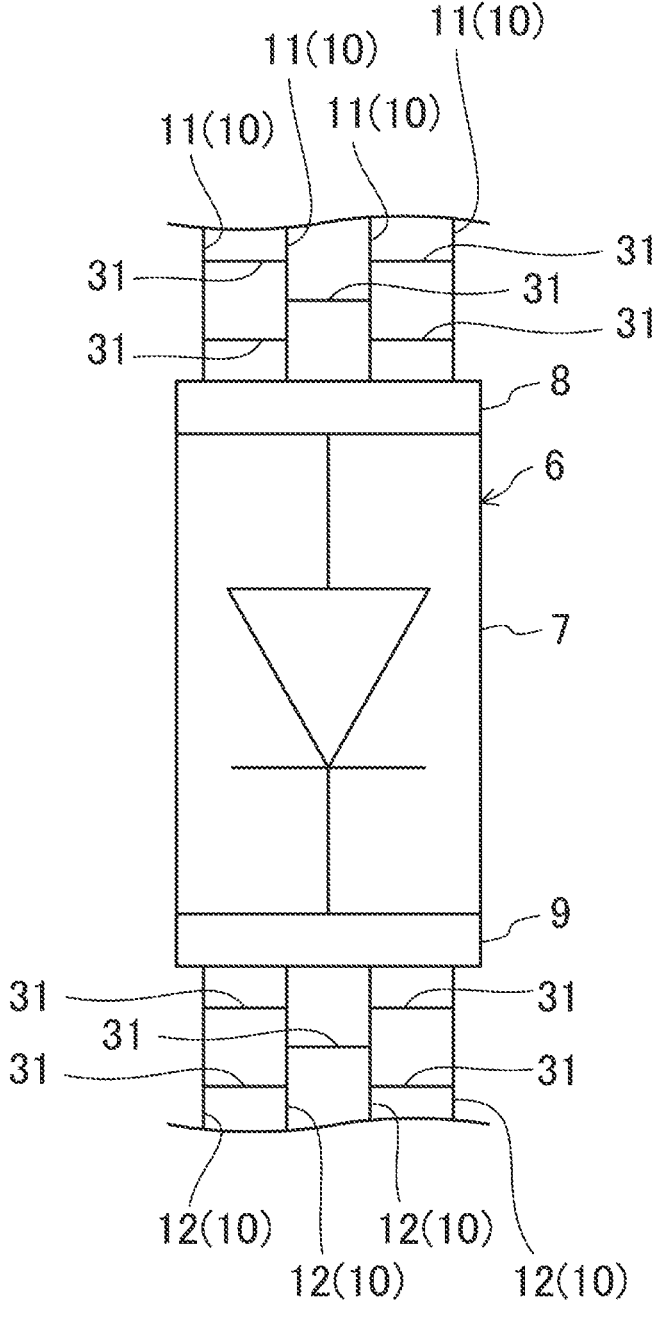
FIG. 5 is a view corresponding to FIG. 3, schematically showing a connection state of each light-emitting element, an anode wire, and a cathode wire in a first variation.

FIG. 5 shows a first variation of the first and second embodiments. As shown in FIG. 5, in the first variation, at least one connecting line 31 is arranged between adjacent main wires 10, 10. The connecting line 31 includes a single thin wire, similar to the thin wire described above that constitutes the main wire 10. The connecting line 31 extends in a direction intersecting (orthogonal to) the direction in which each main wire 10 extends. The connecting line 31 is electrically connected to the main wires 10, 10 adjacent to each other. Four anode wires 11 and four cathode wires 12 are electrically connected to each light-emitting element 6 of this variation.

By providing the connecting line 31, it is possible to maintain a conductive state of the plurality of main wires 10 via the connecting line 31 even if any of the main wires 10 is disconnected due to some factor (for example, effect of external noise). Furthermore, the current flowing through each main wire 10 flows in the connecting line 31 in the present variation; therefore, heat is generated in the connecting line 31, as well. It is thus possible to reduce the amount of heat generated in each main wire 10.

[Second Variation]

Figure 6:
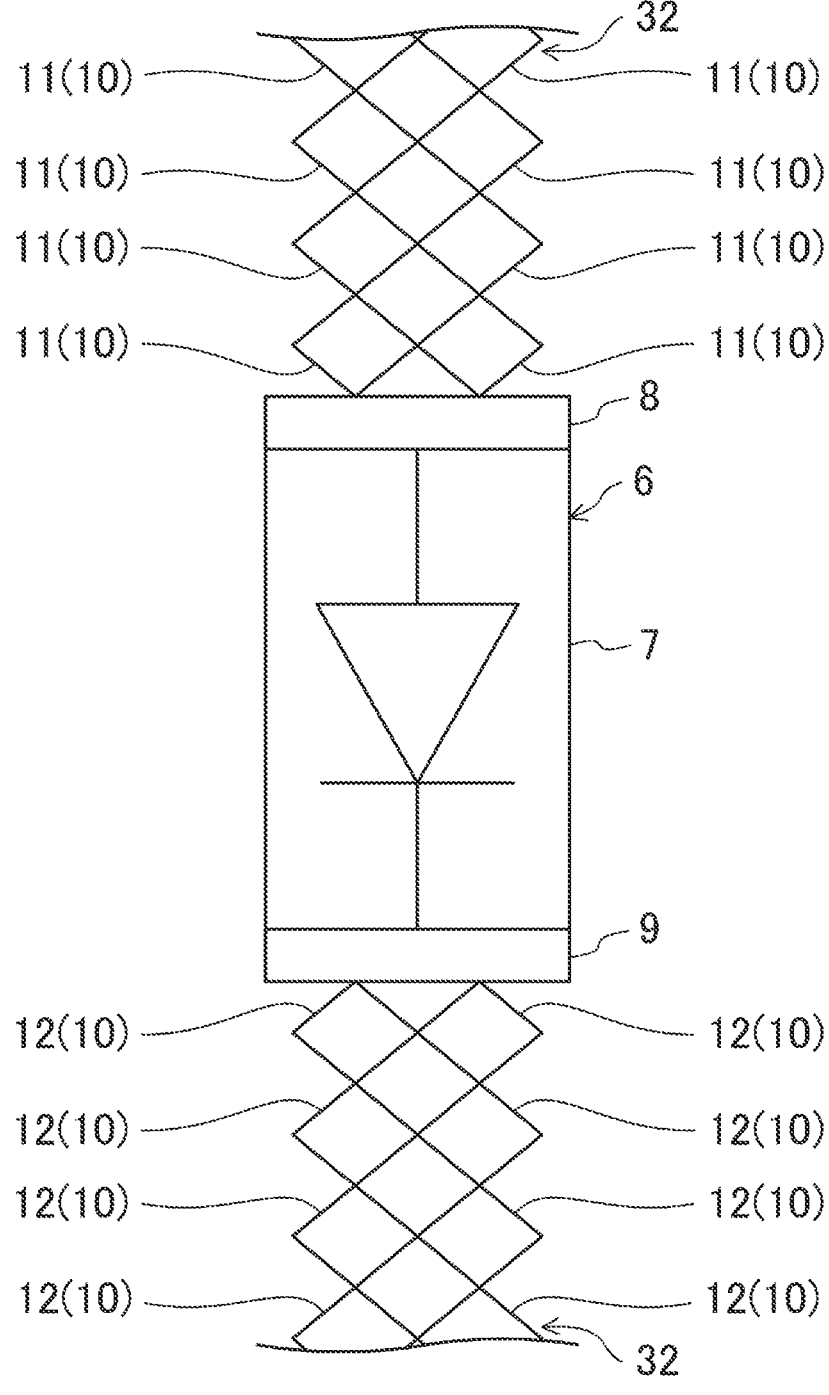
FIG. 6 is a view corresponding to FIG. 3, schematically showing a connection state of each light-emitting element, an anode wire, and a cathode wire in a second variation.

Although the first and second embodiments deal with a case where adjacent main wires 10, 10 do not cross each other, the present disclosure is not limited to this. For example, as in a second variation shown in FIG. 6, the plurality of main wires 10 are formed in a mesh with a plurality of thin wires intersecting one another and arranged at predetermined intervals (equal intervals in the illustrated example). In other words, the plurality of main wires 10 have a mesh structure 32 in which a plurality of cells formed by a plurality of thin wires are regularly arranged. Each of the cells is formed into a parallelogram, for example, with its size identical to that of the others.

A plurality of conduction paths are formed in the mesh structure 32. Therefore, even if some of the conduction paths are cut off due to the disconnection of any thin wire for some reason, the conductive state between the plurality of main wires 10 and each light-emitting element 6 can be maintained as long as the other conduction paths function properly. That is, the reliability of the display structure 1 is ensured.

[Third Variation]

Figure 7:
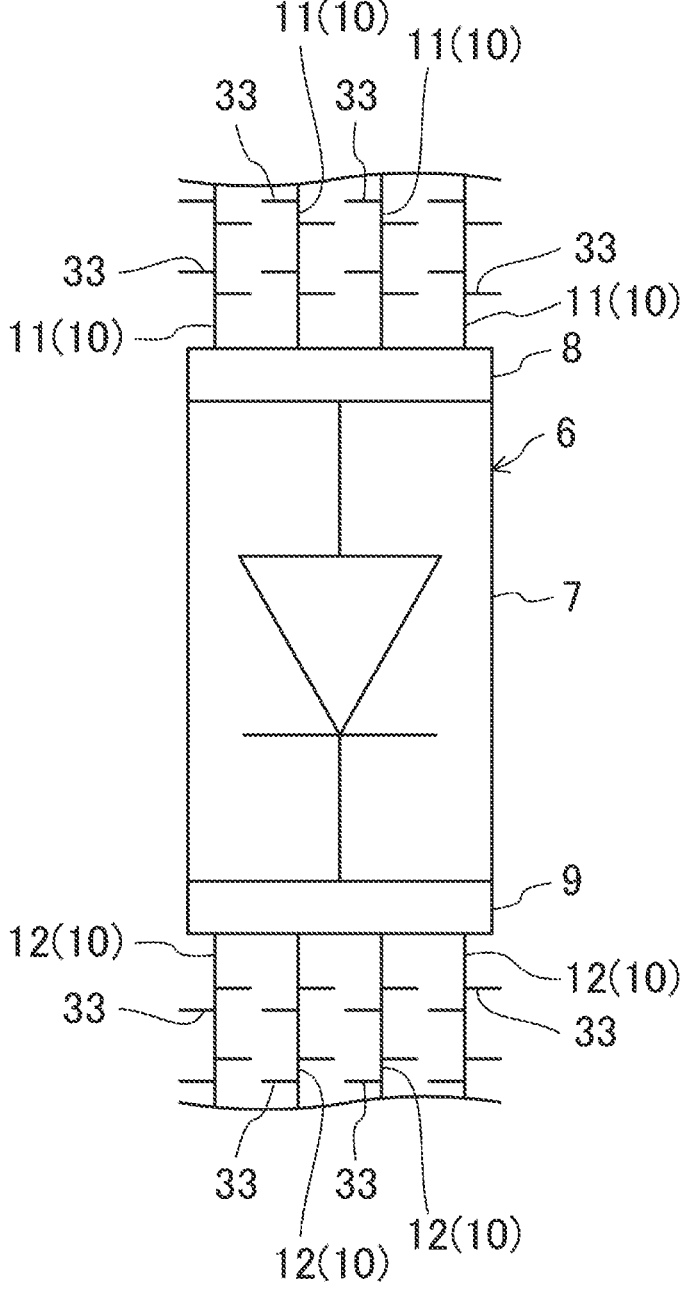
FIG. 7 is a view corresponding to FIG. 3, schematically showing a connection state of each light-emitting element, an anode wire, and a cathode wire in a third variation.

FIG. 7 shows a third variation of the first and second embodiments. As shown in FIG. 7, at least one branch line 33 is provided in each main wire 10. The branch line 33 is branched from a middle portion of each main wire 10 in a direction intersecting (orthogonal to) the direction in which each main wire 10 extends. Each of the branch lines 33 is made of a single thin wire, similar to the thin wire described above that constitutes the main wire 10. Four anode wires 11 and four cathode wires 12 are electrically connected to each light-emitting element 6 of this variation.

In this variation, the current flowing in each of the main wires 10 also flows to branch lines 33, generating heat in the branch lines 33. As a result, the amount of heat generated in each main wire 10 is reduced. The branch lines 33 are also applicable to the main wires 10 of the first variation and the second variation described above.

Other Embodiments

While each of the above embodiments deals with a case where the thin wires constituting the main wires 10 are made of a conductive material embedded in the grooves 5 in the first surface 3 of the substrate 2, the present disclosure is not limited to this. For example, each main wire 10 may be a thin wire made of a conductive material layered on the first surface 3 of the substrate 2. Further, the connecting line 31 of the first variation and the branch line 33 of the third variation may also be a thin wire made of conductive material layered on the first surface 3 of the substrate 2.

While the embodiments of the present disclosure have been described above, the present disclosure is not limited thereto and various modifications can be made within the scope of the present disclosure.

INDUSTRIAL APPLICABILITY

The present disclosure is industrially applicable to a display structure using light-emitting elements.

DESCRIPTION OF REFERENCE CHARACTERS

1: Display Structure
2: Substrate

5: Groove
6: Light-Emitting Element
7: Element Body
8: Anode Terminal
9: Cathode Terminal
10: Main Wire
11: Anode Wire
12: Cathode Wire
20: Microcontroller
21: Power Line
22: Scan Signal Line
23: Data Signal Line
31: Connecting Line
32: Mesh Structure
33: Branch Line
PX1, PX2: Pixel

The invention claimed is:

1. A display structure, comprising:
a film-like substrate made of a resin material;
a plurality of light-emitting elements provided on the substrate; and
a plurality of main wires provided on the substrate and electrically connected to each of the plurality of light-emitting elements, wherein
each of the plurality of light-emitting elements includes an anode terminal and a cathode terminal,
the plurality of main wires include a plurality of anode wires and a plurality of cathode wires,
the plurality of anode wires are electrically connected to the anode terminal, in parallel to one another, and the plurality of cathode wires are electrically connected to the cathode terminal, in parallel to one another, and
the plurality of main wires have a mesh structure in which a plurality of cells formed by a plurality of thin wires are regularly arranged.

2. The display structure of claim 1, further comprising
at least one connecting line provided on the substrate, wherein
the connecting line is configured to electrically connect the main wires adjacent to each other.

3. The display structure of claim 1, further comprising
at least one branch line provided on the substrate, wherein
the branch line branches from a middle portion of a corresponding one of the plurality of main wires in a direction intersecting a direction in which the plurality of main wires extend.

4. The display structure of claim 1, wherein
the plurality of main wires are configured such that the number of the plurality of anode wires and the number of the plurality of cathode wires are equal to each other.

* * * * *